United States Patent
Kim et al.

(10) Patent No.: US 9,741,758 B2
(45) Date of Patent: Aug. 22, 2017

(54) METHODS OF FORMING IMAGE SENSORS INCLUDING DEPOSITED NEGATIVE FIXED CHARGE LAYERS ON PHOTOELECTRIC CONVERSION REGIONS

(71) Applicant: Samsung Electronics Co., Ltd., Suwon-si, Gyeonggi-do (KR)

(72) Inventors: Hyungjoon Kim, Seoul (KR); Hyoungsun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/605,243

(22) Filed: Jan. 26, 2015

(65) Prior Publication Data

US 2015/0311238 A1    Oct. 29, 2015

(30) Foreign Application Priority Data

Apr. 23, 2014   (KR) .................. 10-2014-0048774

(51) Int. Cl.
*H01L 27/146*    (2006.01)

(52) U.S. Cl.
CPC ...... *H01L 27/1463* (2013.01); *H01L 27/1462* (2013.01); *H01L 27/1464* (2013.01); *H01L 27/14609* (2013.01); *H01L 27/14621* (2013.01); *H01L 27/14627* (2013.01); *H01L 27/14685* (2013.01); *H01L 27/14689* (2013.01)

(58) Field of Classification Search
CPC .................................. H01L 27/1463
See application file for complete search history.

(56) References Cited

U.S. PATENT DOCUMENTS

| 8,008,108 | B2 | 8/2011 | Kanbe et al. | |
|---|---|---|---|---|
| 8,283,195 | B2 | 10/2012 | Meynants | |
| 8,343,793 | B2 | 1/2013 | Ohgishi | |
| 8,410,418 | B2 | 4/2013 | Yamaguchi et al. | |
| 8,436,423 | B2 | 5/2013 | Asher et al. | |
| 2008/0164516 | A1* | 7/2008 | Darwish ............ | H01L 29/0649 257/329 |
| 2009/0090988 | A1* | 4/2009 | Ohgishi ............ | H01L 27/1462 257/432 |
| 2012/0012965 | A1* | 1/2012 | Maeda ............... | H04N 5/37457 257/435 |
| 2012/0033119 | A1* | 2/2012 | Shinohara ........ | H01L 27/14623 348/302 |
| 2013/0299675 | A1 | 11/2013 | Yamaguchi et al. | |

FOREIGN PATENT DOCUMENTS

| JP | 2005-283787 | 10/2005 |
|---|---|---|
| JP | 2005-345492 | 12/2005 |
| JP | 2009-111225 | 5/2009 |
| JP | 2010-239154 | 10/2010 |
| JP | 2013-089707 | 5/2013 |
| JP | 2013-089756 | 5/2013 |

OTHER PUBLICATIONS

Konig et al., "Band diagram of the $AlF_3/SiO_2/Si$ system," American Institute of Physics, Journal of Applied Physics 97, 093707 (2005), pp. 093707-1-093707-9.

* cited by examiner

*Primary Examiner* — Lex Malsawma
(74) *Attorney, Agent, or Firm* — Ward and Smith, P.A.

(57) ABSTRACT

A method of forming an image sensor can be provided by forming a respective photoelectric conversion region in each of a plurality of unit pixel regions of a substrate and depositing a material configured to provide a negative fixed charge layer on the photoelectric conversion region.

14 Claims, 11 Drawing Sheets

METHODS OF FORMING IMAGE SENSORS INCLUDING DEPOSITED NEGATIVE FIXED CHARGE LAYERS ON PHOTOELECTRIC CONVERSION REGIONS

CROSS-REFERENCE TO RELATED APPLICATION

This U.S. non-provisional patent application claims priority under 35 U.S.C. §119 to Korean Patent Application No. 10-2014-0048774, filed on Apr. 23, 2014, in the Korean Intellectual Property Office, the disclosure of which is hereby incorporated by reference in its entirety.

BACKGROUND

The inventive concepts relate to image sensors and methods of manufacturing the same.

Image sensors may be classified into charge-coupled device (CCD) type image sensors and complementary metal-oxide-semiconductor (CMOS) type image sensors (CIS). The CIS may include a plurality of two-dimensionally arranged pixels. Each of the pixels may include a photodiode (PD) that coverts incident light into an electrical signal.

As semiconductor devices have been more highly integrated, the image sensors have also been more highly integrated. The sizes of the pixels have also been reduced by the high integration of the image sensors, so the reliability of the image sensors may deteriorate due to a cross-talk between pixels.

A P+ accumulation layer may be formed in an upper portion of a photodiode using an ion implantation process to suppress a dark current caused by traps between the photodiode and an anti-reflection layer. Trap assisted electrons may be recombined with holes existing in the P+ accumulation layer, thereby suppressing the dark current.

The surface of a silicon substrate may be damaged by the ion implantation process, which may produce further trap sites on the surface of the silicon substrate. In addition, a high-temperature process should be performed in order to activate P-type dopants implanted in the P+ accumulation layer.

SUMMARY

Embodiments according to the inventive concept can provide image sensors including deposited negative fixed charge layers on photoelectric conversion regions and methods of forming the same.

In some embodiments, an image sensor can include a substrate having a first surface, a second surface opposite to the first surface, and a plurality of unit pixel regions, where the second surface can be configured to receive incident light. A photoelectric conversion region can be included in each of the unit pixel regions and a negative fixed charge layer can be on the first surface or on the second surface, where the negative fixed charge layer can include a metal fluoride.

In some embodiments, a content ratio of fluorine in the negative fixed charge layer is less than a stoichiometric ratio. In some embodiments, a thickness of the negative fixed charge layer is in a range of about 10 nm to about 500 nm. In some embodiments, the image sensor can further include a silicon oxide layer between the negative fixed charge layer and the first or second surface.

In some embodiments, a thickness of the silicon oxide layer is in a range of about 1 nm to about 50 nm. In some embodiments, the image sensor can further include a deep trench in the substrate that can extend from the second surface toward the first surface, where the deep trench can be configured to isolate the unit pixel regions from each other, where the negative fixed charge layer can extend into the deep trench. In some embodiments, the image sensor can include a silicon oxide layer between the negative fixed charge layer and the second surface and between the negative fixed charge layer and an inner surface of the deep trench.

In some embodiments, the negative fixed charge layer is on the second surface, and the image sensor can further include an interlayer insulating layer and an interconnection layer on the first surface, a color filter array on the negative fixed charge layer, and a micro-lens array on the color filter array.

In some embodiments, an image sensor may include a substrate including a first surface, a second surface opposite to the first surface, and a plurality of unit pixel regions, light incident on the second surface; a photoelectric conversion region formed in the substrate of each of the unit pixel regions; and a negative fixed charge layer disposed on the first surface or the second surface. The negative fixed charge layer may include a metal fluoride.

In some embodiments, a content ratio of fluorine in the negative fixed charge layer may be lower than a stoichiometric ratio.

In some embodiments, a thickness of the negative fixed charge layer may be in a range of about 10 nm to about 500 nm.

In some embodiments, the image sensor may further include a silicon oxide layer disposed between the negative fixed charge layer and the first or second surface.

In some embodiments, a thickness of the silicon oxide layer may be in a range of about 1 nm to about 50 nm.

In some embodiments, the image sensor may further include: a deep trench extending from the second surface toward the first surface and formed in the substrate. The deep trench may isolate the unit pixel regions from each other, and the negative fixed charge layer may extend into the deep trench.

In some embodiments, the image sensor may further include a silicon oxide layer disposed between the negative fixed charge layer and the second surface and between the negative fixed charge layer and an inner surface of the deep trench.

In some embodiments, the negative fixed charge layer may be disposed on the second surface, and the image sensor may further include an interlayer insulating layer and an interconnection layer disposed on the first surface; a color filter array disposed on the negative fixed charge layer; and a micro-lens array disposed on the color filter array.

In some embodiments, the negative fixed charge layer may be disposed on the first surface, and the image sensor may further include an interlayer insulating layer and an interconnection layer disposed on the second surface; a color filter array disposed on the interlayer insulating layer; and a micro-lens array disposed on the color filter array. In this case, the image sensor may further include an anti-reflection layer disposed between the interlayer insulating layer and the color filter array. The anti-reflection layer may include a metal fluoride.

In some embodiments, the negative fixed charge layer may include aluminum fluoride.

In another aspect, a method of forming an image sensor can be provided by forming a respective photoelectric conversion region in each of a plurality of unit pixel regions of a substrate and depositing a material configured to provide a negative fixed charge layer on the photoelectric conversion region.

In some embodiments, depositing a material configured to provide a negative fixed charge layer can include providing a material having a metal-fluorine composition including the fluoride in an amount that is less than a stoichiometric ratio to provide a negative fixed charge for the negative fixed charge layer.

In some embodiments, providing a material having a metal-fluorine composition including the fluorine in an amount that is less than a stoichiometric ratio for the composition to provide a negative fixed charge for the negative fixed charge layer can include providing an aluminum fluoride composition wherein the fluorine in the aluminum fluoride composition is less than that for a stoichiometric ratio for the aluminum fluoride composition.

In some embodiments, depositing a material configured to provide a negative fixed charge layer on the photoelectric conversion region can be preceded by forming a silicon oxide layer on a surface of the photoelectric conversion region and depositing a material configured to provide a negative fixed charge layer on the photoelectric conversion region can include depositing the material on a surface of the silicon oxide layer.

In some embodiments, forming a silicon oxide layer on a surface of the photoelectric conversion region can include forming the silicon oxide layer to a thickness of about 1 nm to about 50 nm on the surface of the photoelectric conversion region. In some embodiments, depositing a material configured to provide a negative fixed charge layer on the photoelectric conversion region can include depositing the material configured to provide a negative fixed charge layer directly on the photoelectric conversion region.

DETAILED DESCRIPTION OF THE EMBODIMENTS

Figure 1:
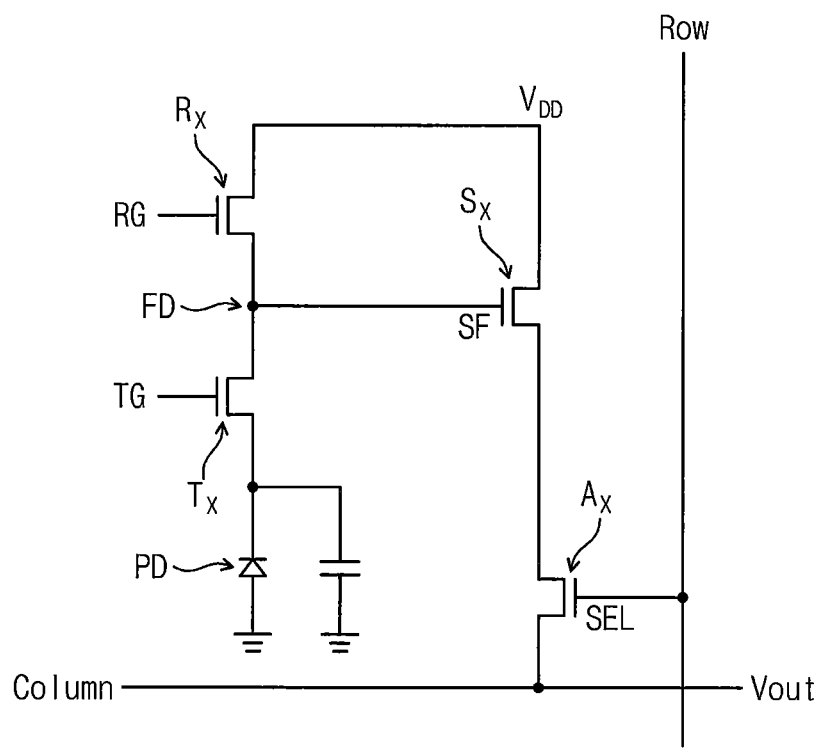
FIG. 1 is a circuit diagram illustrating image sensors according to some embodiments of the inventive concept.

The inventive concept will now be described more fully hereinafter with reference to the accompanying drawings, in which exemplary embodiments of the inventive concept are shown. The advantages and features of the inventive concept will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Exemplary embodiments of aspects of the present inventive concept explained and illustrated herein include their complementary counterparts. The same reference numerals or the same reference designators denote the same elements throughout the specification and drawings.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a circuit diagram illustrating image sensors according to some embodiments of the inventive concept.

Referring to FIG. 1, each of the pixels of an image sensor may include a photoelectric conversion region PD, a transfer transistor $T_X$, a source follower transistor $S_X$, a reset transistor $R_X$, and a selection transistor $A_X$. The transfer transistor $T_X$, the source follower transistor $S_X$, the reset transistor $R_X$, and the selection transistor $A_X$ may include a transfer gate TG, a source follower gate SF, a reset gate RG, and a selection gate SEL, respectively. A photoelectric conversion element is provided by the photoelectric conversion region PD. The photoelectric conversion regions may be an N-type dopant region and a P-type dopant region to provide a photodiode. A drain of the transfer transistor $T_X$ may be a floating diffusion region FD. The floating diffusion region FD may also be the source of the reset transistor $R_X$. The floating diffusion region FD may be electrically connected to the source follower gate SF of the source follower transistor $S_X$. The source follower transistor $S_X$ is connected to the selection transistor $A_X$. The reset transistor $R_X$, the source follower transistor $S_X$, and the selection transistor $A_X$ may be shared by neighboring pixels, so the integration density of the image sensor may be increased.

In reference to FIG. 1, during operation in a dark state, a power voltage $V_{DD}$ is applied to a drain of the reset transistor $R_X$ and a drain of the source follower transistor $S_X$ to discharge charges remaining in the floating diffusion region FD. Thereafter, if the reset transistor $R_X$ is turned-off and light is provided into the photoelectric conversion region PD, electron-hole pairs are generated in the photoelectric conversion region PD. Holes are moved into and accumulated in the P-type dopant region, and electrons are moved into and accumulated in the N-type dopant region. The transfer transistor $T_X$ is turned-on to transfer the charges into the floating diffusion region FD, and the charges are accumulated in the floating diffusion region FD. A gate bias of the source follower transistor $S_X$ is changed in proportion to the amount of the accumulated charges to cause variation in a source potential of the source follower transistor $S_X$. At this time, if the selection transistor $A_X$ is turned-on, a signal caused by the charges can be sensed through a column line.

Figure 2:
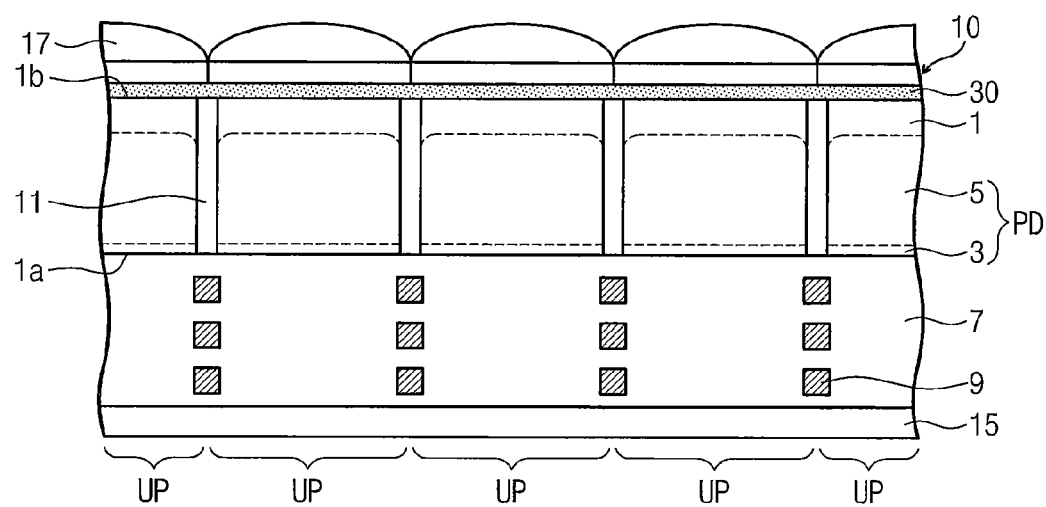
FIG. 2 is a cross-sectional view illustrating image sensors according to some embodiments of the inventive concept.

FIG. 2 is a cross-sectional view illustrating image sensors according to some embodiments of the inventive concept.

Referring to FIG. 2, a deep device isolation layer 11 is disposed in a substrate 1 to define a plurality of unit pixel regions UP. The substrate 1 may include a first surface 1a and a second surface 1b opposite to each other. The substrate 1 may be doped with, for example, P-type dopants. A photoelectric conversion region PD is disposed in each of the unit pixel regions UP. The photoelectric conversion region PD may be a photodiode including a first dopant region 3 and a second dopant region 5. The first dopant region 3 may be doped with, for example, P-type dopants, and the second dopant region 5 may be doped with, for example, N-type dopants. An interlayer insulating layer 7 and an interconnection layer 9 are disposed on the first surface 1a. The transistors $T_X$, $S_X$, $A_X$, and $R_X$ described with reference to FIG. 1 may be disposed on the first surface 1a to sense/transfer charges generated from the photoelectric conversion region PD. A protection layer 15 may be disposed under the interlayer insulating layer 7. The protection layer 15 may be a passivation layer and/or a supporting substrate. A negative fixed charge layer 30 may be disposed on the second surface 1b. The negative fixed charge layer 30 includes a metal fluoride. The negative fixed charge layer 30 may include a metal fluoride having fluorine of which a content ratio is lower than a stoichiometric ratio. In other words, fluorine may be stoichiometrically poor in the negative fixed charge layer 30. In more detail, the negative fixed charge layer 30 may include aluminum fluoride as the metal fluoride. In some embodiments, a thickness of the negative fixed charge layer 30 may be in a range of about 10 nm to about 500 nm.

A color filter array 10 is disposed on the negative fixed charge layer 30. The color filter array 10 may include red, green, and blue color filters which are arranged in a bayer pattern form. A micro-lens array 17 is disposed on the color filter array 10. Light may be input to the photoelectric conversion region PD through the micro-lens array 17, a color filter array 10, the negative fixed charge layer 30, and the second surface 1b. The image sensor may be a back-side illumination image sensor.

In image sensors according to some embodiments of the inventive concept, since the negative fixed charge layer 30 has negative fixed charges, holes may be accumulated around the negative fixed charge layer 30. Thus, it is possible to effectively reduce a dark current and a white spot. The metal fluoride forming the negative fixed charge layer 30 may have the negative fixed charges and may also have an anti-reflection function to increase a light receiving rate. The deep device isolation layer 11 is disposed between the unit pixel regions UP to isolate the unit pixel regions UP from each other, thereby reducing or preventing a cross-talk between the unit pixel regions UP. This means that color reproducibility of the image sensor may be improved.

FIGS. 3 to 6 are cross-sectional views illustrating methods of manufacturing the image sensors of FIG. 2 according to some embodiments of the inventive concept.

Figure 3:
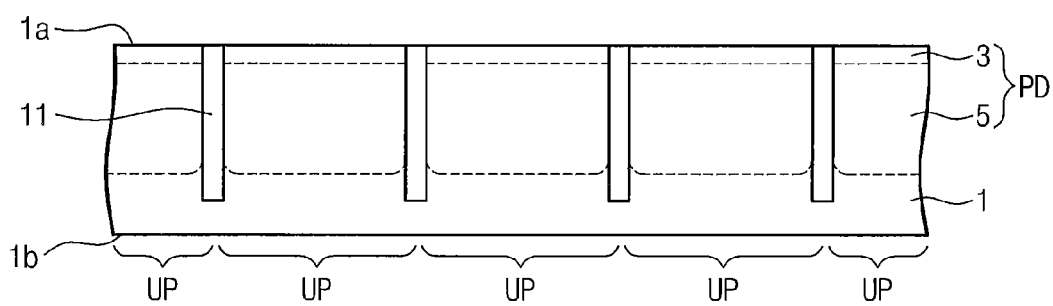
FIGS. 3 to 6 are cross-sectional views illustrating methods of manufacturing the image sensors of FIG. 2 according to some embodiments of the inventive concept.

Referring to FIG. 3, a substrate 1 is prepared. The substrate 1 includes a first surface 1a and a second surface 1b opposite to each other. The substrate 1 may be doped with, for example, P-type dopants. A deep device isolation layer 11 is formed in the substrate 1 to isolate unit pixel regions UP from each other. Ion implantation processes may be performed on the substrate 1 to form photoelectric conversion regions PD in the unit pixel regions UP, respectively. The transfer transistor $T_X$, the source follower transistor $S_X$, the reset transistor $R_X$, and the selection transistor $A_X$ of FIG. 1 are formed on the first surface 1a of the substrate 1.

Figure 4:
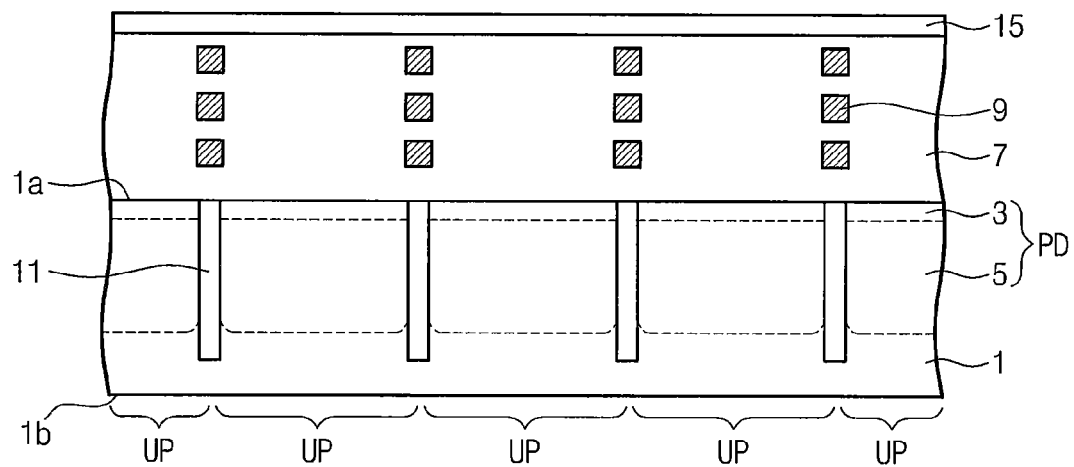

Referring to FIG. 4, an interlayer insulating layer 7 and an interconnection layer 9 are formed on the first surface 1a. A protection layer 15 is formed on the interlayer insulating layer 7.

Figure 5:
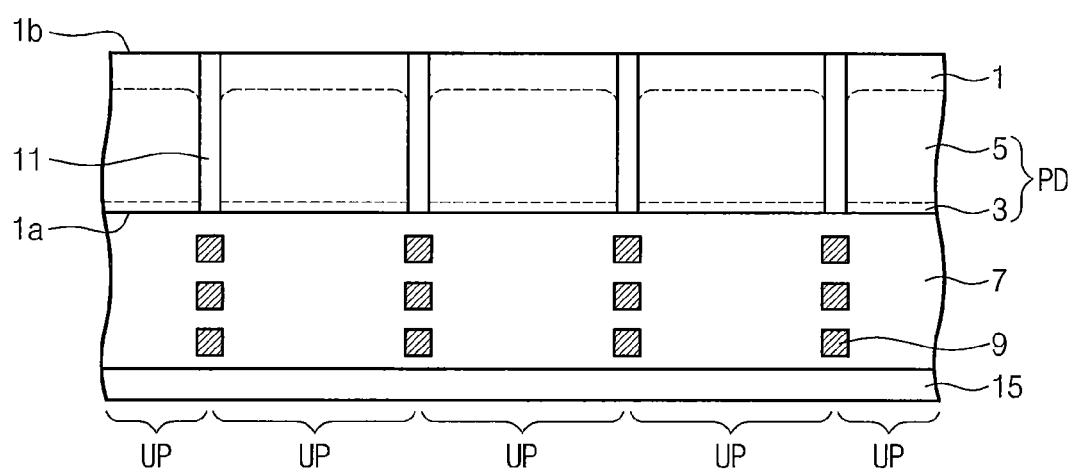

Referring to FIG. 5, the substrate 1 is inverted, so the second surface 1b faces upward. Thereafter, a back-grinding process may be performed on the second surface 1b to a portion of the substrate 1 to expose a bottom surface of the deep device isolation layer 11. In some embodiments, the substrate may not be inverted to perform the back-grinding process.

Figure 6:
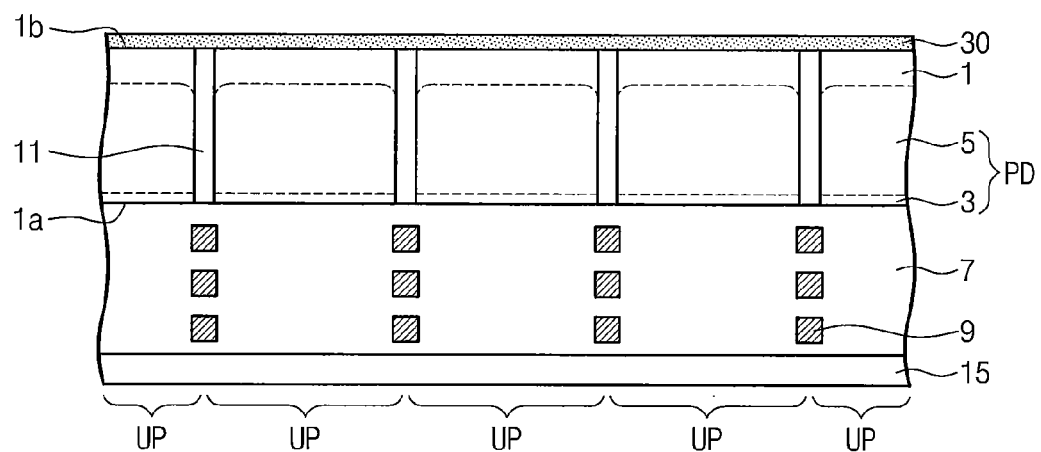

Referring to FIG. 6, a negative fixed charge layer 30 is formed on the second surface 1b. The negative fixed charge layer 30 is formed of a metal fluoride. The negative fixed charge layer 30 may be formed by a deposition process. At this time, an amount of a fluorine-containing gas supplied may be controlled, so a content ratio of fluorine in the metal fluoride may become less than a stoichiometric ratio. Thus, the negative fixed charge layer 30 may have negative fixed charges.

Referring again to FIG. 2, the color filter array 10 and the micro-lens array 17 are sequentially formed on the negative fixed charge layer 30.

Figure 7:
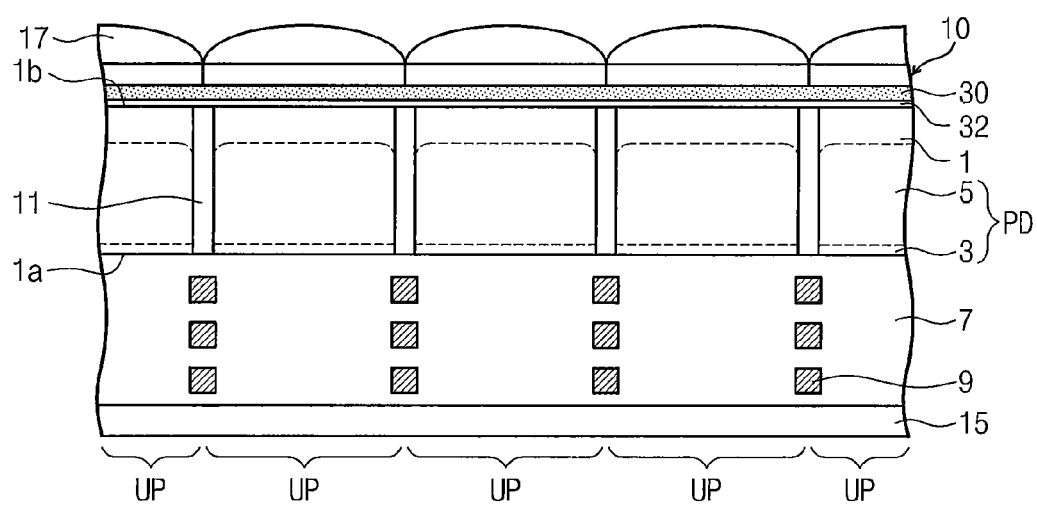
FIG. 7 is a cross-sectional view illustrating image sensors according to some embodiments of the inventive concept.

FIG. 7 is a cross-sectional view illustrating image sensors according to some embodiments of the inventive concept.

Referring to FIG. 7, in an image sensor according to the present embodiment, a silicon oxide layer 32 is disposed between the negative fixed charge layer 30 and the second surface 1b of the substrate 1. In the step of FIG. 5, the silicon oxide layer 32 may be formed by a thermal oxidation process after portions adjacent to the second surface 1b of the substrate 1 are subjected to grinding to expose the bottom surface of the deep device isolation layer 11. Surface defects of the substrate 1 caused by the grinding process may be treated by the formation of the silicon oxide layer 32, thereby reducing an interface trap density. In some embodiments, a thickness of the silicon oxide layer 32 may be in a range of about 1 nm to about 50 nm. If the thickness of the silicon oxide layer 32 is greater than 50 nm, an influence of the negative fixed charge layer 30 on the substrate 1 may be reduced to where the formation of the fixed reserve charges may not provide the desired effect.

Other elements and manufacturing processes of the image sensor of the present embodiment may be the same as or similar to corresponding elements and manufacturing processes described with reference to FIGS. 2 to 6.

Figure 8:
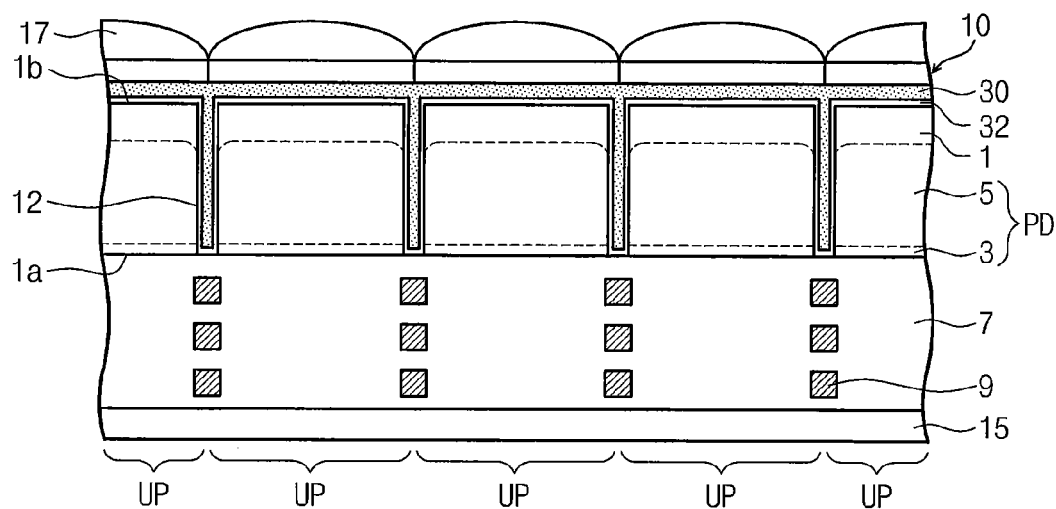
FIG. 8 is a cross-sectional view illustrating image sensors according to some embodiments of the inventive concept.

FIG. 8 is a cross-sectional view illustrating image sensors according to some embodiments of the inventive concept.

Referring to FIG. 8, in an image sensor according to the present embodiment, unit pixel regions UP are separated from each other by a deep trench 12. A silicon oxide layer 32 conformally covers the second surface 1b of the substrate 1 and a sidewall and a bottom surface of the deep trench 12. A negative fixed charge layer 30 disposed on the silicon oxide layer 32 may extend from the second surface 1b into the deep trench 12 to fill the deep trench 12. In the present embodiment, since the negative fixed charge layer 30 is adjacent to a sidewall of the photoelectric conversion region PD, the dark current may be further suppressed. Other elements of the image sensor of the present embodiment may be the same as or similar to corresponding ones of the image sensor of FIG. 7.

Figure 9:
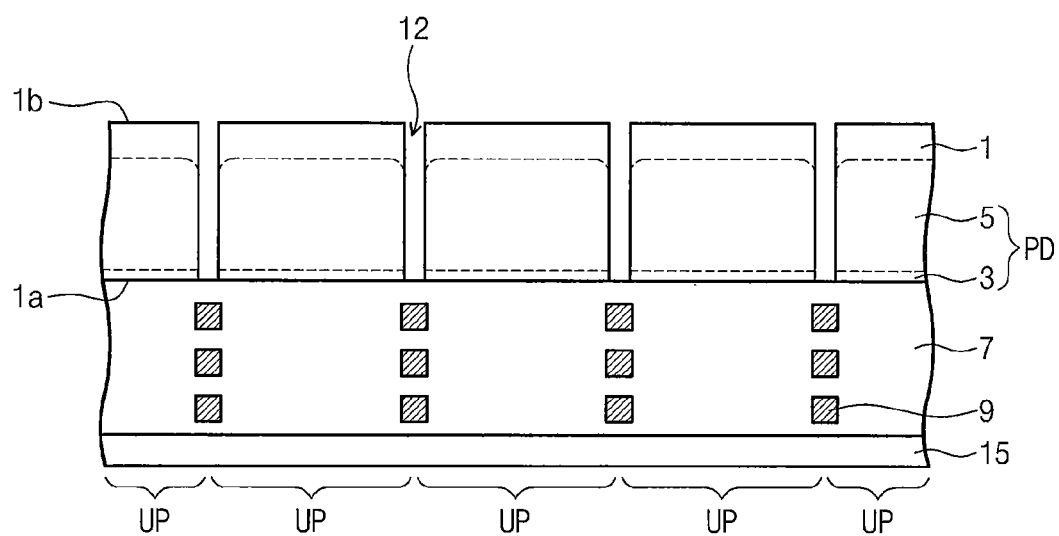
FIG. 9 is a cross-sectional view illustrating methods of manufacturing the image sensors of FIG. 8.

FIG. 9 is a cross-sectional view illustrating methods of manufacturing the image sensors of FIG. 8.

Referring to FIG. 9, after the bottom surface of the deep device isolation layer 11 is exposed by the back-grinding process like FIG. 5, the deep device isolation layer 11 is selectively removed to form a deep trench 12. Subsequently, the silicon oxide layer 32 may be conformally formed on the second surface 1b and an inner surface of the deep trench 12, and the negative fixed charge layer 30 may be formed on the silicon oxide layer 32 to fill the deep trench 12, as illustrated in FIG. 8. Other manufacturing processes of the image sensor of the present embodiment may be the same as or similar to corresponding manufacturing processes described with reference to FIGS. 2 to 6. In the present embodiment, since the deep device isolation layer 11 is selectively removed to form the deep trench 12, misalignment may be reduced during the formation of the deep trench 12.

The image sensors of FIGS. 2, 7, and 8 may correspond to back-side illumination image sensors. However, the inventive concept is not limited thereto. In other embodiments, technical features of the inventive concept may be applied to front-side illumination image sensors. This will be described hereinafter.

Figure 10:
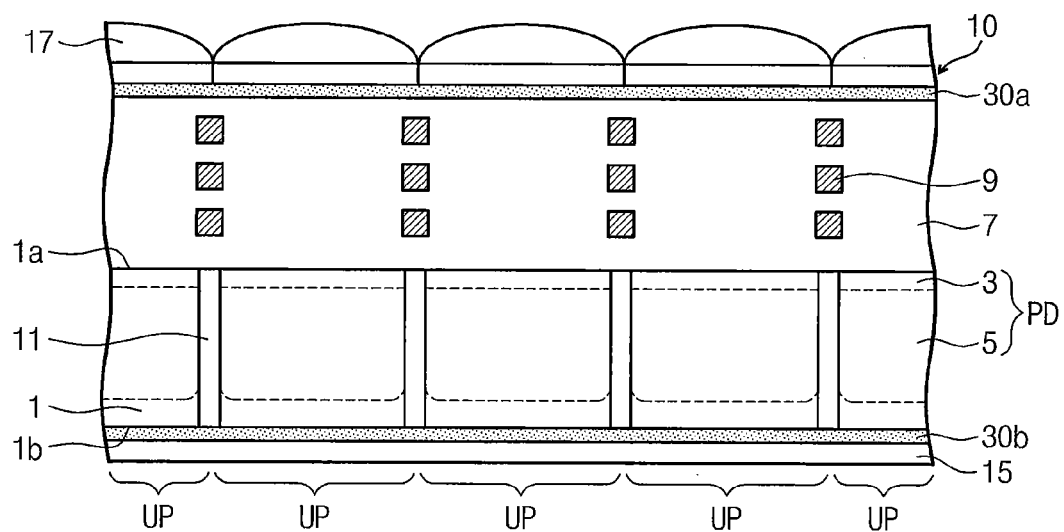
FIG. 10 is a cross-sectional view illustrating image sensors according to some embodiments of the inventive concept.

FIG. 10 is a cross-sectional view illustrating image sensors according to some embodiments of the inventive concept.

Referring to FIG. 10, a deep device isolation layer 11 is disposed in a substrate 1 to define a plurality of unit pixel regions UP. The substrate 1 may include a first surface 1a and a second surface 1b opposite to each other. The substrate 1 may be doped with, for example, P-type dopants. A photoelectric conversion region PD is disposed in each of the unit pixel regions UP. The photoelectric conversion region PD may be a photodiode that includes a first dopant region 3 and a second dopant region 5. The first dopant region 3 may be doped with, for example, P-type dopants, and the second dopant region 5 may be doped with, for example, N-type dopants. An interlayer insulating layer 7 and an interconnection layer 9 are disposed on the first surface 1a. The drawings, the transistors $T_X$, $S_X$, $A_X$, and $R_X$ described with reference to FIG. 1 may be disposed on the first surface 1a to sense/transfer charges generated from the photoelectric conversion region PD. A negative fixed charge layer 30b may be disposed on the second surface 1b. A protection layer 15 may be disposed on the second surface 1b with the negative fixed charge layer 30b therebetween. In other words, the protection layer 15 may be disposed under the negative fixed charge layer 30b. An anti-reflection layer 30a may be disposed on the interlayer insulating layer 7. A color filter array 10 and a micro-lens array 17 are sequentially stacked on the anti-reflection layer 30a. The anti-reflection layer 30a and the negative fixed charge layer 30b may be formed of the same metal fluoride. Light may be input to the photoelectric conversion region PD through the micro-lens array 17, the color filter array 10, the anti-reflection layer 30a, the interlayer insulating layer 7, and the first surface 1a. The image sensor may be the front-side illumination image sensor. Other elements of the image sensor of the present embodiment may be the same as or similar to corresponding elements described with reference to FIG. 2.

Figure 11:
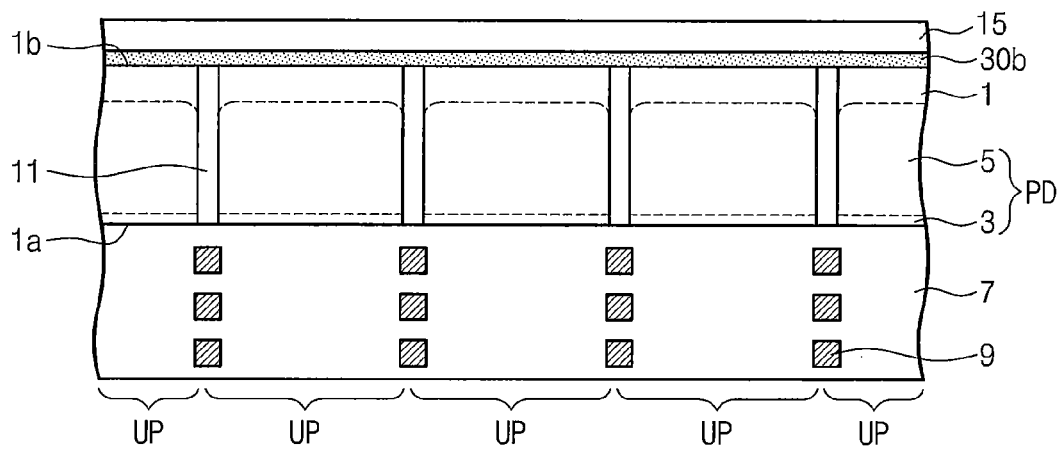
FIG. 11 is a cross-sectional view illustrating methods of manufacturing the image sensors of FIG. 10.

FIG. 11 is a cross-sectional view illustrating methods of manufacturing the image sensors of FIG. 10.

Referring to FIG. 11, an interlayer insulating layer 7 and an interconnection layer 9 are formed on the first surface 1a of the structure illustrated in FIG. 3. The substrate 1 is inverted, so the second surface 1b faces upward. A portion of the substrate 1 adjacent to the second surface 1*b* may be removed by a back-grinding process to expose a bottom surface of the deep device isolation layer 11. A negative fixed charge layer 30*b* and a protection layer 15 are sequentially formed on the second surface 1*b*.

Referring again to FIG. 10, the substrate 1 is inverted again, so the interlayer insulating layer 7 faces upward. An anti-reflection layer 30*a*, a color filter array 10, and a micro-lens array 17 are sequentially formed on the interlayer insulating layer 7. The anti-reflection layer 30*a* and the negative fixed charge layer 30*b* may be formed of the same metal fluoride.

Other manufacturing processes of the image sensor according to the present embodiment may be the same as or similar to corresponding manufacturing processes described with reference to FIGS. 2 to 6.

Figure 12:
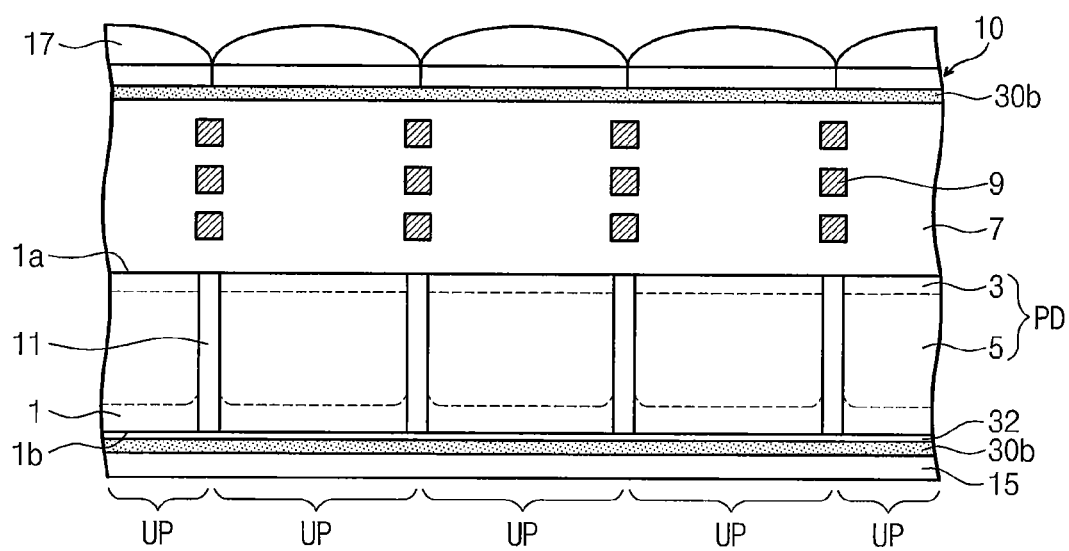
FIG. 12 is a cross-sectional view illustrating image sensors according to some embodiments of the inventive concept.

FIG. 12 is a cross-sectional view illustrating image sensors according to some embodiments of the inventive concept.

Referring to FIG. 12, in an image sensor according to the present embodiment, a silicon oxide layer 32 may be disposed between the second surface 1*b* of the substrate 1 and the negative fixed charge layer 30*b*. The silicon oxide layer 32 may be the same as described with reference to FIG. 7. Other elements of the image sensor of the present embodiment may be the same as or similar to corresponding elements of the image sensor of FIG. 10.

Figure 13:
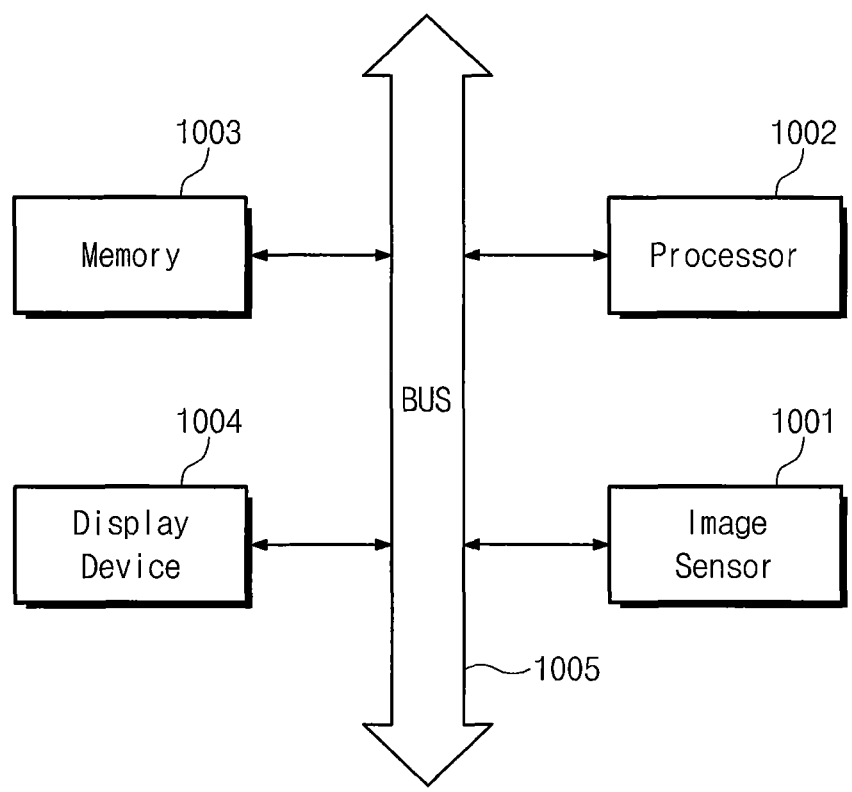
FIG. 13 is a schematic block diagram illustrating electronic devices including an image sensor according to some embodiments of the inventive concept.
Figure 14:
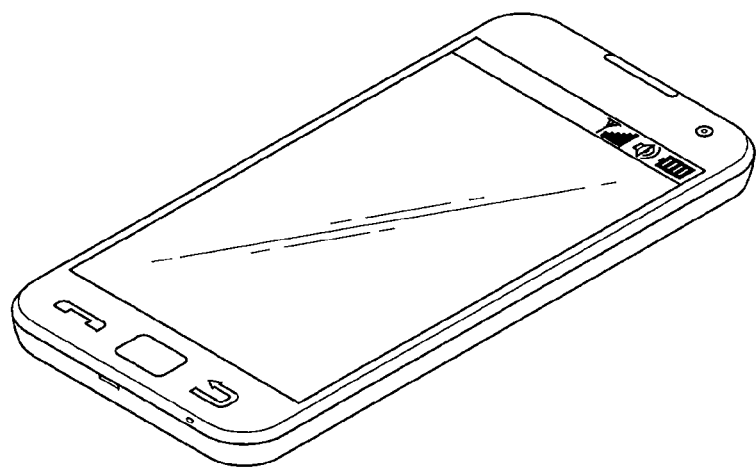
FIGS. 14 to 18 illustrate embodiments of multimedia devices including image sensors according to some embodiments of the inventive concept.
Figure 15:
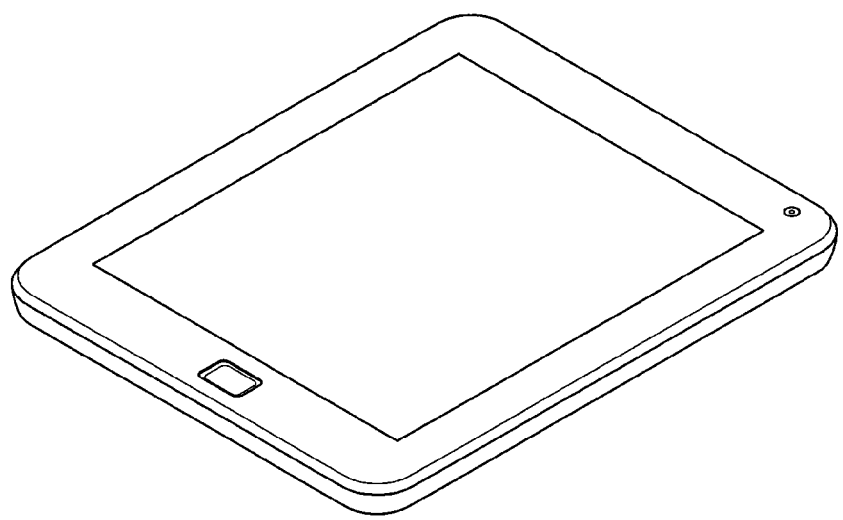
Figure 16:
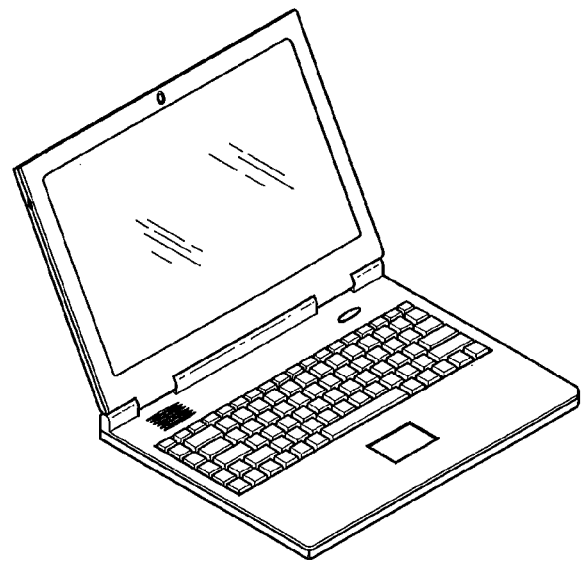
Figure 17:
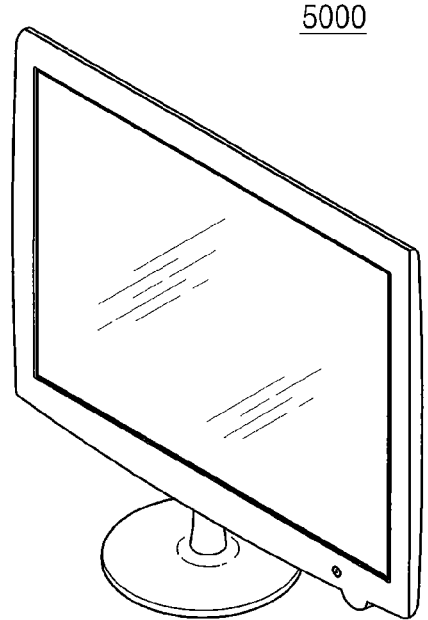
Figure 18:
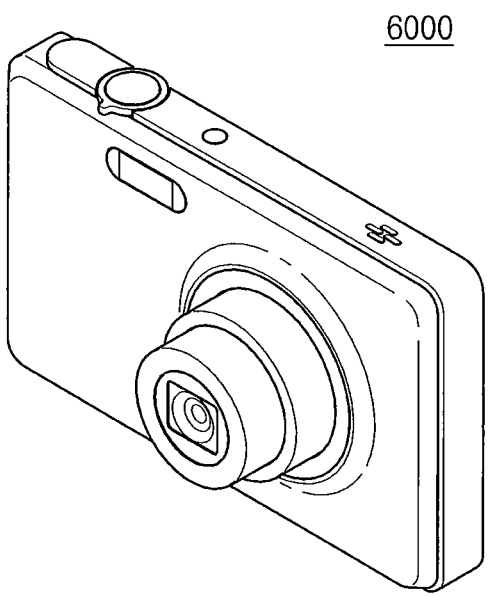

FIG. 13 is a schematic block diagram illustrating electronic devices including an image sensor according to some embodiments of the inventive concept. The electronic devices may include a digital camera or a mobile device. Referring to FIG. 13, the electronic devices may include an image sensor 1001, a processor 1002, a memory device 1003, a display device 1004, and a data bus 1005. The image sensor 1001 may capture an external image in response to control signals of the processor 1002. The processor 1002 may store the captured image data in the memory device 1003 through the data bus 1005. The processor 1002 may output the image data stored in the memory device 1003 to the display device 1004.

FIGS. 14 to 18 illustrate embodiments of multimedia devices including image sensors according to some embodiments of the inventive concept. The image sensors according to some embodiments of the inventive concept may be applied to various multimedia devices having an image photographing function. For example, the image sensor according to some embodiments of the inventive concept may be applied to a mobile or smart phone 2000 illustrated in FIG. 14 and/or a tablet or smart tablet 3000 illustrated in FIG. 15. In addition, the image sensors according to some embodiments of the inventive concept may be applied to a notebook computer 4000 illustrated in FIG. 16 and/or a television or smart television 5000 illustrated in FIG. 17. Moreover, the image sensors according to some embodiments of the inventive concept may be applied to a digital camera or digital camcorder 6000 illustrated in FIG. 18.

In the image sensor according to some embodiments of the inventive concept, the fixed charge layer may be disposed adjacent to at least one surface of the substrate. The fixed charge layer has negative fixed charges, so holes may be accumulated around the fixed charge layer. As a result, it is possible to effectively reduce the dark current and the white spot.

The fixed charge layer may be formed of the metal fluoride so as to have the anti-reflection function as well as the function having the negative fixed charge.

In addition, the silicon oxide layer having a suitable thickness may be disposed between the negative fixed charge layer and the substrate, thereby minimizing the interface trap density.

Furthermore, the deep device isolation layer may be disposed between the unit pixel regions, thereby reducing or preventing the cross-talk between the unit pixel regions. In other words, it is possible to increase the color reproducibility of the image sensor.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing an image sensor on a substrate including a first surface and a second surface opposite to the first surface, wherein the second surface is configured to receive incident light, the method comprising:
   forming a deep device isolation layer in the substrate to define unit pixel regions;
   forming a photoelectric conversion region in each of the unit pixel regions; and
   forming a negative fixed charge layer adjacent to the first surface or the second surface, the negative fixed charge layer including a metal fluoride, wherein the negative fixed charge layer is formed on the first surface, the method further comprising:
   forming an interlayer insulating layer and an interconnection layer on the second surface before forming the negative fixed charge layer; and
   forming a color filter array and a micro-lens array on the interlayer insulating layer.

2. The method of claim 1, further comprising:
   forming a silicon oxide layer before forming the negative fixed charge layer.

3. The method of claim 2 further comprising:
   removing a portion of the substrate adjacent to the second surface to expose a bottom surface of the deep device isolation layer before forming the negative fixed charge layer; and
   removing the deep device isolation layer to form a deep trench.

4. A method of manufacturing an image sensor on a substrate including a first surface and a second surface opposite to the first surface, wherein the second surface is configured to receive incident light, the method comprising:
   forming a deep device isolation layer in the substrate to define unit pixel regions;
   forming a photoelectric conversion region in each of the unit pixel regions; and
   forming a negative fixed charge layer adjacent to the first surface or the second surface, the negative fixed charge layer including a metal fluoride, wherein the negative fixed charge layer is formed on the second surface, the method further comprising:
   forming an interlayer insulating layer and an interconnection layer on the first surface before forming the negative fixed charge layer;
   forming a color filter array and a micro-lens array on the negative fixed charge layer after forming the negative fixed charge layer on the second surface;

removing a portion of the substrate adjacent to the second surface to expose a bottom surface of the deep device isolation layer before forming the negative fixed charge layer; and removing the deep device isolation layer to form a deep trench, wherein the negative fixed charge layer is formed to extend from the second surface into the deep trench.

5. The method of claim 4, further comprising forming a silicon oxide layer on the second surface before forming the negative fixed charge layer on the second surface.

6. The method of claim 5, wherein a portion of the silicon oxide layer is formed in the deep trench and remains in the deep trench between the negative fixed charge layer and the photoelectric conversion region.

7. The method of claim 6, wherein the portion of the silicon oxide layer contacts the interlayer insulation layer.

8. A method of forming an image sensor on a substrate including a first surface and a second surface opposite to the first surface, wherein the second surface is configured to receive incident light, the method comprising:

forming an interlayer insulating layer and an interconnection layer on the second surface;

forming a respective photoelectric conversion region in each of a plurality of unit pixel regions of the substrate; and then depositing a material configured to provide a negative fixed charge layer on the photoelectric conversion region, wherein the interlayer insulating layer and the interconnection layer are formed before forming the material.

9. The method of claim 8 wherein the depositing a material configured to provide a negative fixed charge layer comprises providing a material having a metal-fluoride composition including the fluorine in an amount that is less than a stoichiometric ratio to provide a negative fixed charge for the negative fixed charge layer.

10. The method of claim 9 wherein the providing a material having a metal-fluorine composition including the fluorine in an amount that is less than a stoichiometric ratio for the composition to provide a negative fixed charge for the negative fixed charge layer comprises providing an aluminum fluoride composition wherein the fluorine in the aluminum fluoride composition is less than that for a stoichiometric ratio for the aluminum fluoride composition.

11. The method of claim 8 wherein the depositing a material configured to provide a negative fixed charge layer on the photoelectric conversion region is preceded by forming a silicon oxide layer on a surface of the photoelectric conversion region; and wherein depositing a material configured to provide a negative fixed charge layer on the photoelectric conversion region comprises depositing the material on a surface of the silicon oxide layer.

12. The method of claim 11 wherein the forming a silicon oxide layer on a surface of the photoelectric conversion region comprises forming the silicon oxide layer to a thickness of about 1 nm to about 50 nm on the surface of the photoelectric conversion region.

13. The method of claim 8 wherein the depositing a material configured to provide a negative fixed charge layer on the photoelectric conversion region comprises depositing the material configured to provide the negative fixed charge layer directly on the photoelectric conversion region.

14. The method of claim 8, further comprising:

forming a silicon oxide layer on the second surface before forming the material.

* * * * *